(12) United States Patent
Buchfink

(10) Patent No.: US 12,399,057 B2
(45) Date of Patent: Aug. 26, 2025

(54) METHOD FOR QUALITY INSPECTION OF ULTRASONIC TRANSDUCERS

(71) Applicant: Endress+Hauser Conducta GmbH+Co. KG, Gerlingen (DE)

(72) Inventor: Marvin Buchfink, Leonberg (DE)

(73) Assignee: Endress+Hauser Conducta GmbH+Co. KG, Gerlingen (DE)

( * ) Notice: Subject to any disclaimer, the term of this patent is extended or adjusted under 35 U.S.C. 154(b) by 665 days.

(21) Appl. No.: 17/656,550

(22) Filed: Mar. 25, 2022

(65) Prior Publication Data
US 2022/0307896 A1    Sep. 29, 2022

(30) Foreign Application Priority Data

Mar. 25, 2021 (DE) .................... 10 2021 107 559.9

(51) Int. Cl.
*G01H 11/06* (2006.01)
*G01R 27/26* (2006.01)
(Continued)

(52) U.S. Cl.
CPC ......... *G01H 11/06* (2013.01); *G01R 27/2605* (2013.01); *H10N 30/02* (2023.02); *H10N 30/101* (2024.05); *H10N 30/88* (2023.02)

(58) Field of Classification Search
CPC ........ H10N 30/01; H10N 30/02; H10N 30/03; H10N 30/302; H10N 30/88;
(Continued)

(56) References Cited

U.S. PATENT DOCUMENTS 5,664,456 A * 9/1997 Eckert ................ G01F 23/2962
                                                 310/326
5,711,327 A    1/1998 Fields
(Continued)

FOREIGN PATENT DOCUMENTS

CN       102944275 A     2/2013
CN       105264543 A     1/2016
(Continued)

OTHER PUBLICATIONS

DE 4035828 translation from FIT database (Year: 2025).*
KR 100941684 translation from FIT database (Year: 2025).*

*Primary Examiner* — Jeffrey T Carley
*Assistant Examiner* — Joshua D Anderson
(74) *Attorney, Agent, or Firm* — Mark A. Logan; Endress+Hauser (USA) Holding, Inc.

(57) ABSTRACT

A method for the quality inspection of an ultrasonic transducer and an ultrasonic sensor comprising an ultrasonic transducer and carrying out the quality inspection method are described. The ultrasonic transducer comprises a housing having an electrically conductive layer extending at least over an inner surface of a housing wall of the housing, and a piezoelectric transducer arranged in the housing, the end face of which equipped with an electrode is connected to the electrically conductive layer by means of a dielectric coupling layer. According to the method, at least one quality inspection of the ultrasonic transducer is carried out, in which a capacitance of a capacitor comprising the electrode, the electrically conductive layer serving as the counter electrode, and the dielectric coupling layer as a dielectric is measured and a quality defect of the ultrasonic transducer is determined if the measured capacitance is outside a specified capacitance range.

15 Claims, 3 Drawing Sheets

(51) Int. Cl.
*H10N 30/00* (2023.01)
*H10N 30/02* (2023.01)
*H10N 30/88* (2023.01)

(58) Field of Classification Search
CPC .............. G01R 27/2605; B06B 1/0644; B06B 2201/55; Y10T 29/49004; Y10T 29/49005
See application file for complete search history.

(56) References Cited

U.S. PATENT DOCUMENTS

| | | | | |
|---|---|---|---|---|
| 2002/0180316 | A1* | 12/2002 | Linden .................... | G10K 9/122 |
| | | | | 310/348 |
| 2006/0076854 | A1* | 4/2006 | Deserno ................ | H04R 17/00 |
| | | | | 310/328 |
| 2007/0273249 | A1* | 11/2007 | Eckert ..................... | B06B 1/067 |
| | | | | 310/334 |
| 2008/0067895 | A1* | 3/2008 | Adachi ................ | A61B 8/4483 |
| | | | | 310/324 |
| 2017/0089868 | A1 | 3/2017 | Beaty | |

FOREIGN PATENT DOCUMENTS

| | | | |
|---|---|---|---|
| DE | 4035828 A1 | 5/1992 | |
| DE | 29509574 A4 | 7/1996 | |
| DE | 10055893 A1 | 5/2002 | |
| DE | 10344741 A1 | 4/2005 | |
| EP | 0815954 A2 | 1/1998 | |
| KR | 100941684 B1 * | 2/2010 | ............. G01N 29/11 |
| WO | 0145081 | 6/2001 | |

* cited by examiner

METHOD FOR QUALITY INSPECTION OF ULTRASONIC TRANSDUCERS

CROSS-REFERENCE TO RELATED APPLICATION

The present application is related to and claims the priority benefit of German Patent Application No. 10 2021 107 559.9, filed on Mar. 25, 2021, the entire contents of which are incorporated herein by reference.

TECHNICAL FIELD

The present disclosure relates to a method for the quality inspection of ultrasonic transducers having a piezoelectric transducer arranged in a housing, to a method comprising said quality inspection method for producing at least one quality-inspected ultrasonic transducer, to a method comprising said production method for producing at least one ultrasonic sensor, and to an ultrasonic sensor designed to carry out the quality inspection method.

BACKGROUND

Ultrasonic transducers usually comprise a piezoelectric transducer which, depending on the application, can be used as a transmitter, as a receiver, or both as a transmitter and as a receiver of ultrasonic signals and is arranged in a housing for protection against environmental influences. So that ultrasonic signals can be transmitted and/or received despite the housing, the piezoelectric transducer is mounted in the housing by means of a coupling layer, such as an adhesive bond, which connects an end face of the piezoelectric transducer to a housing wall of the housing.

Ultrasonic transducers are used, for example, in ultrasonic sensors, as are already used in a large number of different fields of application, especially, in the food industry, in the water and wastewater industry, in chemistry, and especially also in measuring and control technology.

An example of this are ultrasonic sensors for measuring and/or monitoring a fill level of a filling material in a container or an open channel. In this case, a transmission signal, for example, a short ultrasonic wave pulse, is transmitted in the direction of the filling material and its echo signal reflected on a surface of the filling material is received by means of an ultrasonic transducer serving as transmitter and as receiver, for example. In addition, a signal propagation time is measured which the ultrasonic signals require for the route from the ultrasonic transducer to the filling material surface and from the filling material surface back to the ultrasonic transducer. From the measured signal propagation time, the fill level corresponding to the distance of the ultrasonic transducer from the filling material surface is then determined on the basis of the propagation speed of ultrasonic signals above the filling material. Analogously, it is of course also possible to use two ultrasonic transducers, one of which serves as a transmitter and the other as a receiver, for measuring and/or monitoring fill levels instead of an ultrasonic transducer serving as a transmitter and as a receiver.

In the production of ultrasonic sensors, for example, action is taken in such a way that an ultrasonic transducer is produced by mounting a piezoelectric transducer by means of a coupling layer in the housing of the ultrasonic transducer. Subsequently, the ultrasonic sensor is produced by means of the ultrasonic transducer by connecting a sensor electronic system to the piezoelectric transducer of the ultrasonic transducer. In addition, the housing of the ultrasonic transducer is generally filled with a potting compound and/or closed in another way. Finally, a final control of the ultrasonic sensors produced in this way is generally carried out in order to ensure that all the ultrasonic sensors produced satisfy quality standards specified for this purpose.

The coupling layer of the ultrasonic transducer is significantly responsible for the transmission and/or reception characteristic of the ultrasonic sensor and thus constitutes a very important component with regard to compliance with quality standards.

Quality defects, potentially caused by errors in the production of ultrasonic transducers, such as deviations of a layer thickness of the coupling layer from a target value specified therefor, deviations of material properties of the coupling layer from target properties specified therefor, and any potentially present inhomogeneities within a coupling layer, result in ultrasonic sensors manufactured with deficient ultrasonic transducers not satisfying the specified quality standards and consequently having to be withdrawn from service.

Accordingly, it would be desirable to already be able to detect quality defects of ultrasonic transducers at an early stage before these ultrasonic transducers are used for further use, such as for the production of ultrasonic sensors.

In this respect, it is problematic that the quality of the coupling layer cannot be easily inspected after its production because the coupling layer is covered by the piezoelectric transducer once the piezoelectric transducer has been inserted into the housing. In order to be able to inspect the quality of the coupling layer anyway, the ultrasonic transducer can be cut open. However, this results in the destruction of the ultrasonic transducer so that this type of inspection can at best be used on a random basis.

An inspection of the quality of the coupling layer on the basis of a transmitting and/or receiving characteristic of the ultrasonic transducer can generally only be carried out by means of the ultrasonic sensor comprising the ultrasonic transducer since this especially also requires the sensor electronic system which is connected to the piezoelectric transducer and by means of which the ultrasonic transducer can be operated as a transmitter and/or receiver of ultrasonic sensors.

Both result in the fact that any problems that occur in the production of ultrasonic transducers, especially, the coupling layers thereof, can routinely be detected only during the final inspection of the finished ultrasonic sensors.

For time and cost reasons, ultrasonic transducers and ultrasonic sensors are usually produced in batches. Accordingly, the occurrence of method errors during the production of the ultrasonic transducers can cause whole batches of ultrasonic sensors to have quality defects and to generally have to be disposed of as a result.

Furthermore, quality defects of the ultrasonic transducer, which can impair the function of the ultrasonic sensor, can also arise over time during the service life, especially, also during operation, of an ultrasonic sensor. Examples thereof are deformations of the coupling layer potentially caused by high pressures and/or mechanical loads, as well as changes in the coupling layer due to aging and/or moisture penetrating into the housing, such as condensate.

SUMMARY

An object of the present disclosure is to specify a method for the quality inspection of ultrasonic transducers, with which method a high quality of the ultrasonic transducers, especially, of the coupling layers, can be ensured.

For this purpose, the present disclosure comprises a method for the quality inspection of an ultrasonic transducer, wherein the ultrasonic transducer
- comprises a housing which on the inside has an electrically conductive layer, which extends at least over an inner surface of a housing wall of the housing, and
- comprises a piezoelectric transducer which is arranged in the housing and whose end face equipped with an electrode is connected to the electrically conductive layer by means of a dielectric coupling layer,
- in which at least one quality inspection of the ultrasonic transducer is carried out, in which a capacitance of a capacitor comprising the electrode, the electrically conductive layer serving as the counter electrode, and the dielectric coupling layer as a dielectric is measured, and
- a quality defect of the ultrasonic transducer is determined if the measured capacitance is outside a specified capacitance range.

The method offers the advantage that any potentially present defects that affect the measured capacitance are detected by means of the quality inspection. Since the coupling layer forms the dielectric of the capacitor, it is especially also possible to detect any potentially present defects of the coupling layer, without the ultrasonic transducer having to be cut open or inserted into an ultrasonic sensor for this purpose. These defects include, especially, deviations of a layer thickness of the coupling layer from a target value specified therefor, deviations of at least one material property of the coupling layer from a target property specified therefor, and any potentially present inhomogeneities within the coupling layer.

Another advantage is that with the quality inspection method, the quality of ultrasonic transducers used in an ultrasonic sensor can especially also be checked and/or monitored. The latter offers the advantage that, during the service life, especially, during operation of an ultrasonic sensor as well, quality defects of the ultrasonic transducer occurring over time are detected at an early stage and the ultrasonic sensor can optionally be replaced or repaired. As a result, measurement errors caused by quality defects as well as any consequential damage caused by measurement errors are avoided.

According to a first embodiment, the specified capacitance range is determined in advance by measuring the capacitances of a plurality of structurally identical ultrasonic transducers, by determining a target value and a tolerance for the capacitance on the basis of the measured capacitances, and by determining the capacitance range on the basis of the target value and the tolerance.

According to one embodiment of the first embodiment, only measured capacitances of ultrasonic transducers that satisfy specified quality standards are used to determine the capacitance range,
- wherein especially the ultrasonic transducers that satisfy the specified quality standards are identified by checking whether the coupling layer thereof fulfills at least one specified quality criterion, fulfills a criterion for a layer thickness of the coupling layer, fulfills a criterion for a homogeneity of the coupling layer, and/or fulfills a criterion for a dielectric constant of the coupling layer.

A first development comprises a method in which at least one possible cause of the quality defect determined on the basis of the respective measured capacitance is determined on the basis of at least one measured capacitance outside the specified capacitance range in each case, wherein
- a layer thickness of the coupling layer above a target layer thickness specified for the coupling layer is determined as a possible cause if the measured capacitance is less than a lower limit of the capacitance range,
- a layer thickness of the coupling layer below the target layer thickness is determined as a possible cause if the measured capacitance is greater than an upper limit of the capacitance range,
- inhomogeneities of the coupling layer and/or deviations of a dielectric constant of the coupling layer from a target value specified therefor are determined as a possible cause if the measured capacitance is outside the capacitance range,
- damage to the piezoelectric transducer and/or the electrode is determined as a possible cause if the measured capacitance is below the lower limit of the capacitance range,
- an assembly error, in which the piezoelectric transducer has been mounted in such a way that the electrode arranged on the end face thereof is located on the side of the piezoelectric transducer facing away from the coupling layer, is determined as a possible cause if the measured capacitance is below the lower limit of the capacitance range,
- a short circuit is determined as a possible cause if the measured capacitance is greater than or equal to a specified maximum value above the upper limit of the capacitance range, and/or
- an impairment of an electrical conductivity of an electrically conductive connection extending from the electrode via a first connecting line of the piezoelectric transducer is determined as a possible cause if the measured capacitance is less than or equal to a specified minimum value below the lower limit of the capacitance range.

Further embodiments comprise a method in which
- the piezoelectric transducer comprises a piezoelectric element on whose end face facing away from the electrode a second electrode is arranged, and/or a plurality of piezoelectric elements, which are arranged in a stack one above the other and/or can in each case be electrically contacted via an electrode arranged thereon, and/or
- the dielectric coupling layer is a dielectric coupling layer embodied as an adhesive bond or as a potting layer.

Further embodiments comprise a method in which
a) the housing consists of an electrically conductive material or a metal, and the electrically conductive layer is an integral part of the conductive housing, or
b) the housing consists of an electrical insulator made of polyphenylene sulfide (PPS) or of an electrically insulating plastic and has, on the inside, an electrically conductive coating, which forms or comprises the electrically conductive layer.

Optionally, the coating is designed, for example, in such a way that it
- comprises a coating region which forms or comprises the electrically conductive layer and extends over the inner side of the housing wall facing the piezoelectric transducer in the ultrasonic transducer, and
- either extends over all inner surfaces of the housing or comprises at least one further coating region extending over an inner side of a housing wall surrounding the piezoelectric transducer on the outside.

Furthermore, the present disclosure comprises a method comprising the previously mentioned quality inspection method for producing at least one quality-inspected ultrasonic transducer, in which in the production of each ultrasonic transducer, the housing and the piezoelectric transducer equipped with the electrode at the end face are provided, wherein the housing has, on the inside, the electrically conductive layer, which extends at least over the inner surface of the housing wall of the housing, the piezoelectric transducer is mounted in the housing by connecting the end face of the piezoelectric transducer equipped with the electrode to the electrically conductive layer by means of the dielectric coupling layer, the quality inspection is carried out in which the capacitance of the capacitor comprising the electrode, the electrically conductive layer serving as the counter electrode, and the dielectric coupling layer as a dielectric is measured, and the ultrasonic transducer is provided as a quality-inspected ultrasonic transducer for further use if the measured capacitance is within the specified capacitance range.

With regard to the production of ultrasonic transducers, the quality inspection method, which can be carried out immediately after the assembly of the piezoelectric transducer, offers the advantage that method errors, which potentially occur during production and result in quality defects, can be determined at an early stage and corrected accordingly.

With regard to the further use of ultrasonic transducers, the quality inspection method offers the advantage that material, time and costs associated with the further use of the defective ultrasonic transducers are avoided due to the use of quality-inspected ultrasonic transducers.

An embodiment of the production method comprises a method in which those ultrasonic transducers in which a quality defect has been determined by the quality inspection are disposed of or supplied to a recycling process, and/or a method error, which led to a quality defect detected by means of the quality inspection, is determined and corrected.

Furthermore, the present disclosure comprises a method comprising the previously mentioned production method for producing at least one ultrasonic sensor, in which in each case action is taken during the production of each ultrasonic sensor in such a way that a sensor electronic system is connected to the piezoelectric transducer of the quality-inspected ultrasonic transducer or of one of the quality-inspected ultrasonic transducers.

One embodiment of the last-mentioned method provides that in the production of at least one ultrasonic sensor, a potting is introduced into the housing, and/or the housing is closed by means of a closure element.

A development of the quality inspection method comprises a method in which the ultrasonic transducer is part of an ultrasonic sensor, the ultrasonic sensor comprises a capacitance measuring device, which is connected to the electrode via a first connecting line of the piezoelectric transducer and connected to the layer via a second connecting line and is designed to measure the capacitance of the capacitor, and each quality inspection is carried out in each case by means of the capacitance measuring device of the ultrasonic sensor.

A development of the last-mentioned development comprises a method in which the quality of the ultrasonic transducer of the ultrasonic sensor is monitored by quality inspections carried out recurrently, periodically, or at specified or specifiable times, and/or an alarm is output if a quality defect is detected by means of the quality inspections.

Furthermore, the present disclosure comprises an ultrasonic sensor having an ultrasonic transducer with a piezoelectric transducer which is arranged in the housing and whose end face equipped with an electrode is connected by means of a dielectric coupling layer to an electrically conductive layer extending at least over an inner surface of a housing wall of the housing, and a testing device, wherein the testing device comprises a capacitance measuring device, which is connected via a first connecting line of the piezoelectric transducer to the electrode and via a second connecting line to the layer and which is designed to measure a capacitance of a capacitor comprising the electrode, the electrically conductive layer serving as the counter electrode, and the dielectric coupling layer as a dielectric, and is designed to measure, at least once, recurrently, periodically, or at specified or specifiable times, the capacitance of the capacitor by means of the capacitance measuring device in each case and to determine and output a quality defect of the ultrasonic transducer if the measured capacitance is outside a specified capacitance range.

Developments of the ultrasonic sensor consist in that the testing device comprises a control and evaluation unit which is connected to the capacitance measuring device and is designed to trigger the capacitance measurements and to check, on the basis of the capacitance measured by means of the capacitance measuring device and the capacitance range stored in a memory assigned to the control and evaluation unit, whether the measured capacitance is within or outside the capacitance range, the testing device is designed to output or display an alarm if the measured capacitance is outside the specified capacitance range, the testing device is designed as part of a sensor electronic system of the ultrasonic sensor or is connected to the sensor electronic system, by means of which the ultrasonic transducer can be operated as a transmitter, as a receiver, or as both a transmitter and a receiver of ultrasonic signals, wherein the control and evaluation unit and/or the sensor electronic system are designed in such a way that a transmitting and/or receiving operation of the ultrasonic sensor, in which ultrasonic signals are transmitted and/or received by means of the ultrasonic transducer, is interrupted during the duration of the respective capacitance measurement, and/or the ultrasonic sensor is designed as a sensor operating according to the propagation time principle for measuring and/or monitoring a fill level of a filling material.

BRIEF DESCRIPTION OF THE DRAWINGS

The present disclosure and its advantages are now explained in greater detail on the basis of the figures of the FIG. 1 shows an ultrasonic transducer.

DETAILED DESCRIPTION

Figure 1:
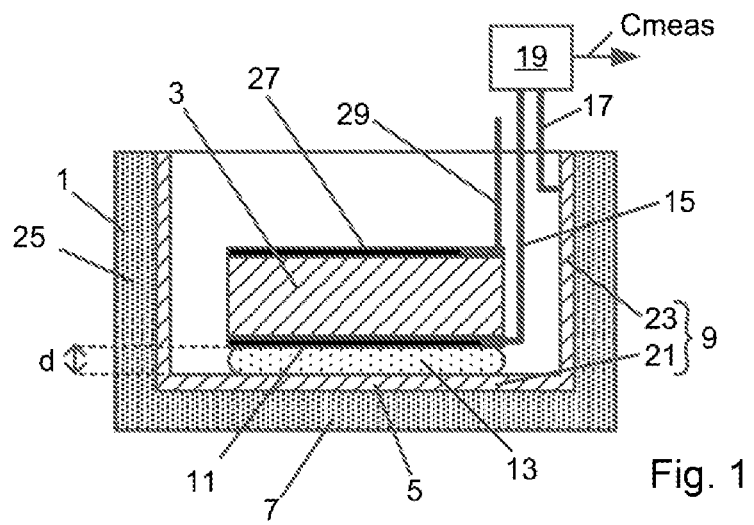

The present disclosure relates to a method for the quality inspection of ultrasonic transducers having a housing 1 and a piezoelectric transducer 3 mounted in the housing 1. An example of such an ultrasonic transducer is shown in FIG. 1.

The quality inspection method can be used in conjunction with ultrasonic transducers whose housing 1 has, on the inside, an electrically conductive layer 5 which extends at least over an inner surface of a housing wall 7 of the housing 1, on which the piezoelectric transducer 3 is mounted in the housing 1.

If the housing 1 consists of an electrical insulator, such as polyphenylene sulfide (PPS) or another electrically insulating plastic, the housing 1 has, for example on the inside, an electrically conductive coating 9, which forms or comprises the electrically conductive layer 5. This embodiment is shown in FIG. 1.

Alternatively, the housing 1 can consist of an electrically conductive material, such as a metal. In this modification, shown in FIG. 2, of the ultrasonic transducer shown in FIG. 1, the electrically conductive layer 5 is an integral part of the conductive housing 1.

In addition, the piezoelectric transducer 3 is equipped with an electrode 11 arranged on the end face thereof facing the housing wall 7 and is connected to the housing wall 7 via a dielectric coupling layer 13 arranged between the electrode 11 and the layer 5. A suitable dielectric coupling layer 13 is, for example, an adhesive bond or a potting layer.

The quality inspection method comprises at least one quality inspection of the ultrasonic transducer. In each quality inspection, a capacitance C of a capacitor comprising the electrode 11, the electrically conductive layer 5 serving as the counter electrode, and the dielectric coupling layer 13 as a dielectric is measured in each case.

The capacitance C is measured, for example, by means of a capacitance measuring device 19, which, at least during the quality inspection, is connected for this purpose to the electrode 11 via a first connecting line 15 and to the layer 5 via a second connecting line 17 and which provides a capacitance measurement result corresponding to the measured capacitance Cmeas. A connecting line of the piezoelectric transducer 3, which is provided for the electrical connection of the piezoelectric transducer 3 to the electrode 11, is especially suitable as the first connecting line 15. A line that is in electrically conductive contact with the layer 5 at least during the capacitance measurement is suitable, for example, as the second connecting line 17.

Subsequently, the measured capacitance Cmeas is compared to a capacitance range ΔC specified for the capacitance C. A range in which the capacitances C of ultrasonic transducers of the type of the ultrasonic transducer to be inspected are in a qualitatively perfect state of said transducers is especially suitable as a capacitance range ΔC.

If the capacitance Cmeas measured within the scope of the quality inspection is outside the specified capacitance range ΔC, a quality defect is determined.

The described method has the advantages already mentioned at the outset.

Optionally, individual method steps and/or individual parts of the ultrasonic transducer can each have embodiments that can be used individually and/or in combination with one another. Some examples in this respect are listed below.

For example, the coating 9, which is shown in FIG. 1 and forms or comprises the electrically conductive layer 5, is designed as a metallic coating. For this purpose, for example, an aluminum coating or a coating applied as a metallization is suitable.

The coating 9 comprises at least one coating region 21 which forms or comprises the electrically conductive layer 5 and extends over the inner side of the housing wall 7 facing the piezoelectric transducer 3 in the ultrasonic transducer. Optionally, the coating 9 can extend over all the inner surfaces of the housing 1 and/or, in addition to the coating region 21, comprise at least one further coating region 23, such as the further coating region 23 shown in FIG. 1 and extending over an inner side of a housing wall 25 surrounding the piezoelectric transducer 3 on the outside. This offers the advantage of a more comprehensive shielding of the piezoelectric transducer 3 from electromagnetic interference, which shielding is effected by the conductivity of the coating 9.

A suitable piezoelectric transducer 3 is, for example, a transducer consisting of a single piezoelectric element. In this case, the transducer is equipped, for example, with a second electrode 27, which is arranged, for example, on a rear side of the piezoelectric transducer 3 facing away from the electrode 11 and/or can be electrically contacted via a connecting line 29 connected thereto. Alternatively, however, a piezoelectric transducer can also be used which comprises two or more piezoelectric elements, such as piezoelectric elements arranged one above the other in a stack and/or piezoelectric elements that can each be electrically contacted via an electrode arranged thereon.

With regard to the quality inspection, a capacitance range that is determined experimentally in advance is especially suitable as a specified capacitance range ΔC. In this case, the method comprises a method step which is upstream of the first quality inspection and in which the capacitance range ΔC is determined.

Figure 2:
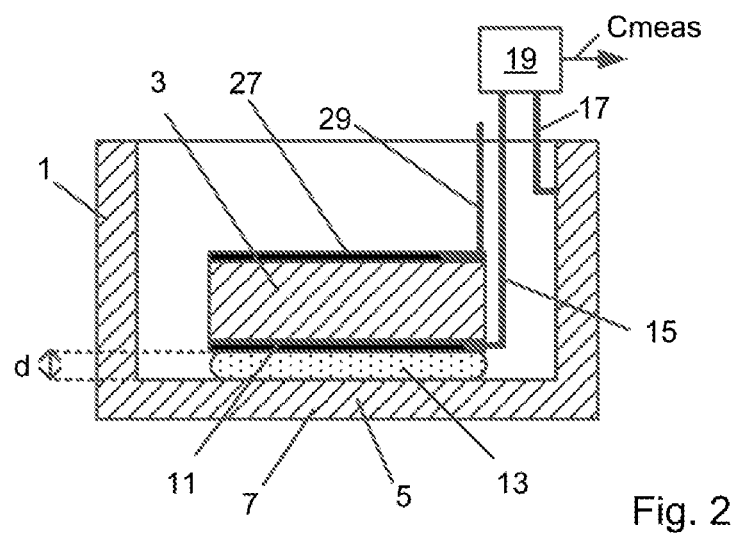
FIG. 2 shows an ultrasonic transducer having an electrically conductive housing.

The experimental determination can be carried out, for example, in such a way that the capacitances C of a plurality of structurally identical ultrasonic transducers are measured in the manner shown in FIGS. 1 and 2, and a target value Ct and a tolerance +/−Tc for the capacitances C are determined on the basis of the measured capacitances Cmeas. In this case, the capacitance range ΔC is determined, for example, in such a way that its lower limit C1 is equal to the target value Ct minus the tolerance Tc and its upper limit C2 is equal to the target value Ct plus the tolerance Tc.

In order to determine target value Ct and tolerance +/−Tc, preferably only the measured capacitances Cmeas of those ultrasonic transducers that satisfy specified quality standards are used.

The ultrasonic transducers satisfying the specified quality standards can be identified, for example, by checking whether their coupling layer 13 fulfills at least one specified quality criterion. In this respect, a criterion for a layer thickness d of the coupling layer 13, a criterion for a homogeneity of the coupling layer 13, and/or a criterion for a dielectric constant εr of the coupling layer 13 are suitable as quality criteria. The compliance with these quality criteria is checked, for example, by cutting open the ultrasonic transducers, and checking the compliance with the quality criteria on the basis of the coupling layers 13 accessible thereby.

Subsequent to the determination of the capacitance range ΔC, the quality inspection method is available for testing any number of structurally identical ultrasonic transducers.

Optionally, the quality inspection method may comprise at least one further method step.

For example, ultrasonic transducers for which the measured capacitance C23 is within the specified capacitance range ΔC, can be identified as ultrasonic transducers that are free of quality defects and/or can be provided for further use as quality-inspected ultrasonic transducers.

Alternatively or additionally, within the scope of the quality inspection method, action is optionally taken, for example, in such a way that in each case at least one possible cause of the determined quality defect is determined on the basis of at least one measured capacitance Cmeas, which in each case is outside the specified capacitance range ΔC.

In this case, use is made, for example, of the fact that the capacitance C of the capacitors of the ultrasonic transducers can be described at least approximately by $C:=\varepsilon 0\ \varepsilon r\ A/d$, wherein ε0 is a dielectric constant of a vacuum, εr is a dielectric constant of the coupling layer 13, A is a capacitor surface dependent on an electrode surface of the electrode 11, and d is a layer thickness of the coupling layer 13.

Accordingly, for example, a layer thickness d of the coupling layer 13 above a target layer thickness specified for the coupling layer 13 is determined as a possible cause of the quality defect detected on the basis of the measured capacitance Cmeas, if the measured capacitance Cmeas is less than the lower limit C1 of the specified capacitance range ΔC.

Analogously, a layer thickness d of the coupling layer 13 below the target layer thickness is determined as a possible cause of the quality defect detected on the basis of the measured capacitance Cmeas, if the measured capacitance Cmeas is greater than the upper limit C2 of the capacitance range ΔC.

Furthermore, action is taken in such a way, for example, that inhomogeneities of the coupling layer 13 and/or deviations of the dielectric constant εr of the coupling layer 13 from a target value specified therefor are determined as a possible cause of the quality defect detected on the basis of the measured capacitance Cmeas if the measured capacitance Cmeas is outside the capacitance range ΔC.

Deviations in the dielectric constant εr of the coupling layer 13 from the target value can occur, for example, if a different adhesive or another potting compound for producing the coupling layer 13 was inadvertently used, if the adhesive or the potting compound is cured only to an insufficient extent, and/or if the dielectric properties of the coupling layer 13 have changed as a result of outgassing and/or absorbed moisture.

Piezoelectric transducers 3 are generally mechanically sensitive and can break, especially, in the event of incorrect transport, incorrect assembly, and mechanical overload. This generally leads to the usually very thin electrode 11 breaking, which regularly results in a reduction of the capacitor surface A and thus also of the capacitance C of the capacitor.

Accordingly, action is taken, for example, in such a way that damage to the piezoelectric transducer 3 and/or the electrode 11 is determined as a possible cause of the quality defect detected on the basis of the measured capacitance Cmeas if the measured capacitance Cmeas is below the lower limit C1 of the capacitance range ΔC.

If, during the production of the ultrasonic transducer, the piezoelectric transducer 3 is inadvertently mounted in such a way that the electrode 11 arranged on the end face thereof is located on the side of the piezoelectric transducer 3 facing away from the coupling layer 13, the capacitance Cmeas measured by means of the capacitance measuring device 19 connected to the electrode 11 and the layer 5 can be described at least approximately as a capacitance of a series connection of a first and a second capacitor. In the embodiment illustrated, the first capacitor is formed by the piezoelectric transducer 3 equipped with the electrode 11 and the second electrode 27. The second capacitor comprises, in this case, for example, the second electrode 27, the electrically conductive layer 5 serving as a counter electrode, and the coupling layer 13 arranged in this case between the second electrode 27 and the layer 5. The capacitance of this series connection is regularly significantly smaller than the target capacitance Ct. Accordingly, action is taken, for example, in such a way that an assembly error by means of which the piezoelectric transducer 3 has been mounted in such a way that the electrode 11 arranged on the end face thereof is located on the side of the piezoelectric transducer 3 facing away from the coupling layer 13 is determined as a possible cause of the quality defect detected on the basis of the measured capacitance Cmeas if the measured capacitance Cmeas is below the lower limit C1 of the capacitance range ΔC.

If a short circuit occurs, as a result of which the capacitor, whose capacitance C is measured during the quality inspection, is short-circuited, this results in the measured capacitance Cmeas being extremely high or even infinitely high. Accordingly, action is taken, for example, in such a way that a short circuit is determined as a possible cause of the quality defect detected on the basis of the measured capacitance Cmeas if the measured capacitance Cmeas is greater than or equal to a specified maximum value Cmax above the upper limit C2 of the capacitance range ΔC.

Conversely, impairments of the electrical conductivity of the electrically conductive connection extending via the electrode 11 and the first connecting line 15, such as impairments caused by a cable break within the first connecting line 15 and/or by an erroneous electrical contact between the electrode 11 and the first connecting line 15, result in the measured capacitance Cmeas being extremely low or even equal to zero. Accordingly, action is taken, for example, in such a way that an impairment of the electrical conductivity of the electrically conductive connection extending via the electrode 11 and the first connecting line 15 is determined as a possible cause of the quality defect detected on the basis of the measured capacitance Cmeas, if the measured capacitance Cmeas is less than or equal to a specified minimum value Cmin below the lower limit C1 of the capacitance range ΔC.

The quality inspection offers the advantage that all quality defects induced by the aforementioned possible causes are detected.

Figure 3:
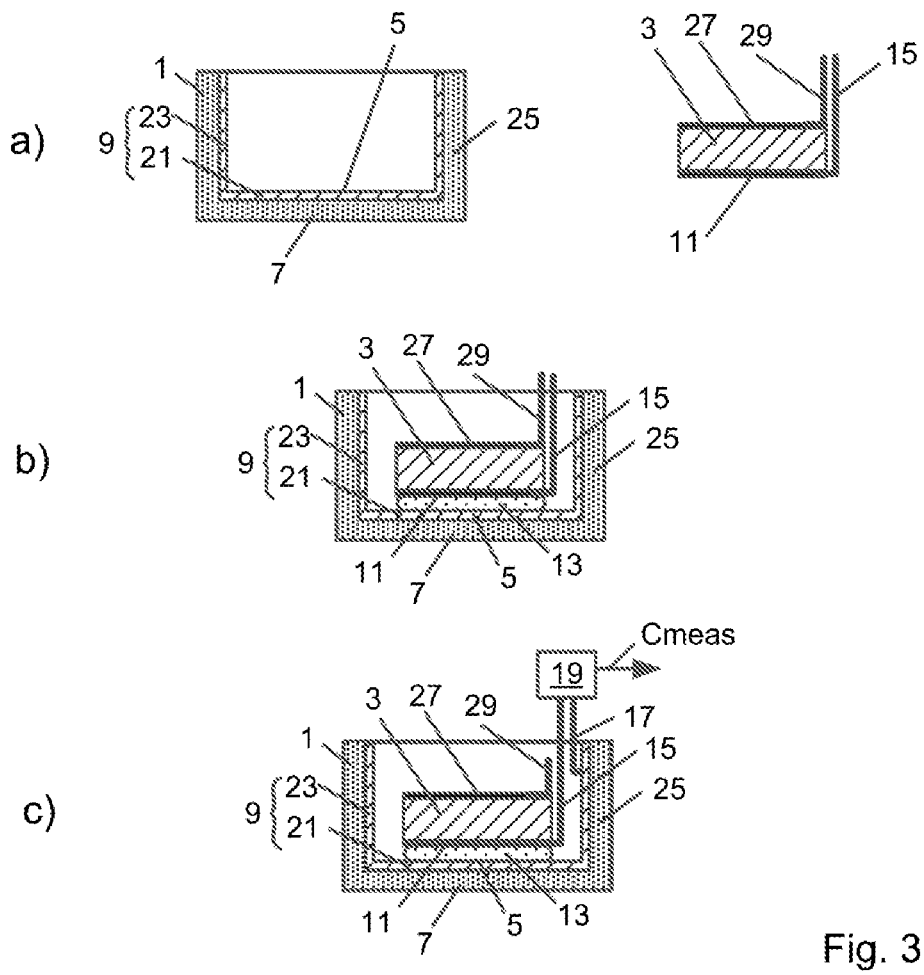
FIG. 3 shows method steps of a production method for producing a quality-inspected ultrasonic transducer.

Optionally, the quality inspection method described above can be used, for example, to produce quality-inspected ultrasonic transducers. In the production of quality-inspected ultrasonic transducers, action is taken in the manner shown in FIG. 3 using the example of the ultrasonic transducer shown in FIG. 1, in such a way that the housing 1 having the electrically conductive layer 5 and the piezoelectric transducer 3 equipped with the electrode 11 at the end face are provided in method step a).

Subsequently, the piezoelectric transducer 3 is mounted in the housing 1 in method step b) in that the end face of the piezoelectric transducer 3 equipped with the electrode 11 is connected by means of the dielectric coupling layer 13 to the layer 5 arranged on the inner side of the housing wall 7 of the housing 1.

When producing a coupling layer 13 embodied as an adhesive bond, action is taken, for example, in such a way that adhesive is applied to the electrode 11 and/or to the layer 5, the piezoelectric transducer 3 is inserted into the housing 1, and the adhesive is subsequently either cured automatically or cured in a curing process specified for the selected adhesive.

When producing a coupling layer 13 embodied as a potting layer, action is taken, for example, in such a way that potting compound is applied to the layer 5, the piezoelectric transducer 3 is inserted into the housing 1, and the potting compound is subsequently either cured automatically or cured in a curing process specified for the selected potting compound.

Subsequently, in method step c), the previously described quality inspection method is carried out, in which the capacitance C of the capacitor comprising the electrode 11, the layer 5 serving as a counter electrode, and the coupling layer 13 as a dielectric is measured and the measured capacitance Cmeas is compared to the specified capacitance range ΔC. If the measured capacitance Cmeas is within the capacitance range ΔC, the ultrasonic transducer is provided as a quality-inspected ultrasonic transducer for further use.

If the measured capacitance Cmeas is outside the specified capacitance range ΔC, a quality defect is naturally also detected with the quality inspection method carried out within the scope of the production method. In this case, action is preferably taken in such a way that a method error of the production method that led to the quality defect is determined and subsequently preferably also corrected.

In this case, the previously described possible causes, which can be determined on the basis of the measured capacitance, make it easier to find and accordingly also eliminate the method errors of the production method causing the corresponding quality defects.

Optionally, action is taken, for example, in such a way that those ultrasonic transducers in which a quality defect was determined by the quality inspection are disposed of or supplied to a recycling process.

Figure 4:
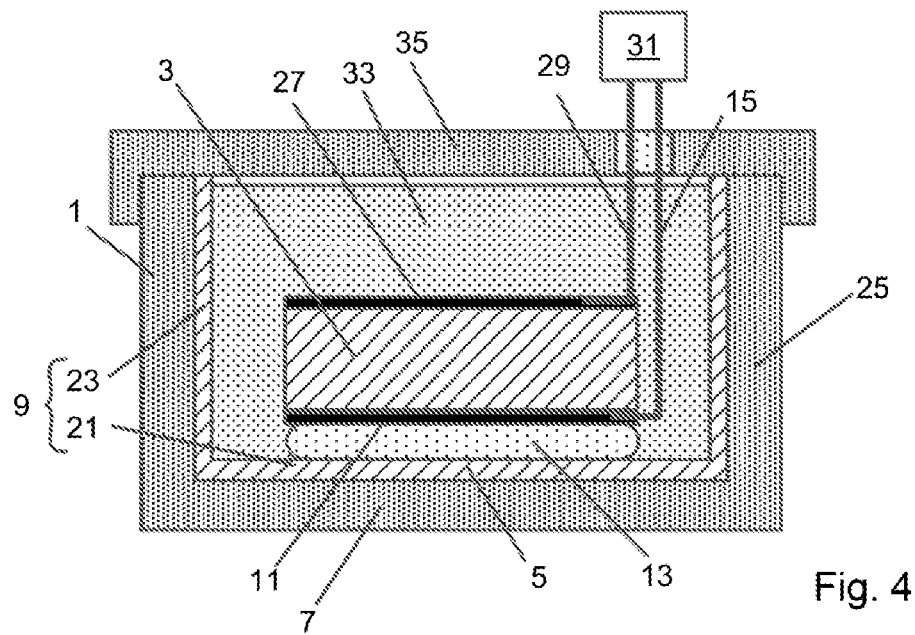
FIG. 4 shows an ultrasonic sensor having a quality-inspected ultrasonic transducer.

Conversely, the ultrasonic transducers provided as quality-inspected ultrasonic transducers for further use are preferably further used accordingly. One possible use is to use at least one or each of these quality-inspected ultrasonic transducers to produce an ultrasonic sensor. In this respect, the present disclosure also especially comprises a method for producing at least one ultrasonic sensor, the method comprising the previously described method for producing quality-inspected ultrasonic transducers, as well as ultrasonic sensors comprising quality-inspected ultrasonic transducers. An example of such an ultrasonic sensor is shown in FIG. 4.

In the production of these ultrasonic sensors, action is taken, for example, in each case in such a way that a sensor electronic system 31 is connected to the piezoelectric transducer 3 of the quality-inspected ultrasonic transducer.

Optionally, the production method comprises at least one further manufacturing step, such as a manufacturing step in which a potting 33 is introduced into the housing 1, and/or a manufacturing step in which the housing 1 is closed by means of a closure element 35. In this case, the ultrasonic sensor additionally comprises the potting 33 and/or the closure element 35.

The quality inspection method described above can be used not only within the scope of production methods of quality-inspected ultrasonic transducers, and of ultrasonic sensors, but alternatively or additionally also in finished ultrasonic sensors. In this case, the ultrasonic transducer to be inspected is in each case part of an ultrasonic sensor. In this variant, the ultrasonic sensor is designed, for example, in such a way that it comprises the capacitance measuring device 19 connected to the electrode 11 via the first connecting line 15 of the piezoelectric transducer 3 and to the layer 5 via the second connecting line 17. Accordingly, action is taken, for example, in such a way that each quality inspection of the ultrasonic transducer of the ultrasonic sensor is carried out by means of the capacitance measuring device 19 of the ultrasonic sensor.

Optionally, in this use of the quality inspection method, action is taken, for example, in such a way that the quality of the ultrasonic transducer of the ultrasonic sensor is monitored by quality inspections carried out recurrently, periodically, or at specified or specifiable times, and/or an alarm is output if a quality defect is detected by means of the quality inspections.

In this respect, the present disclosure also especially comprises an ultrasonic sensor having an ultrasonic transducer, such as the ultrasonic transducer shown in FIG. 1 or 2, and a testing device 37 which is designed to carry out the previously described method for the quality inspection of the ultrasonic transducer of the ultrasonic sensor. An example of such an ultrasonic sensor is shown in FIG. 5.

Figure 5:
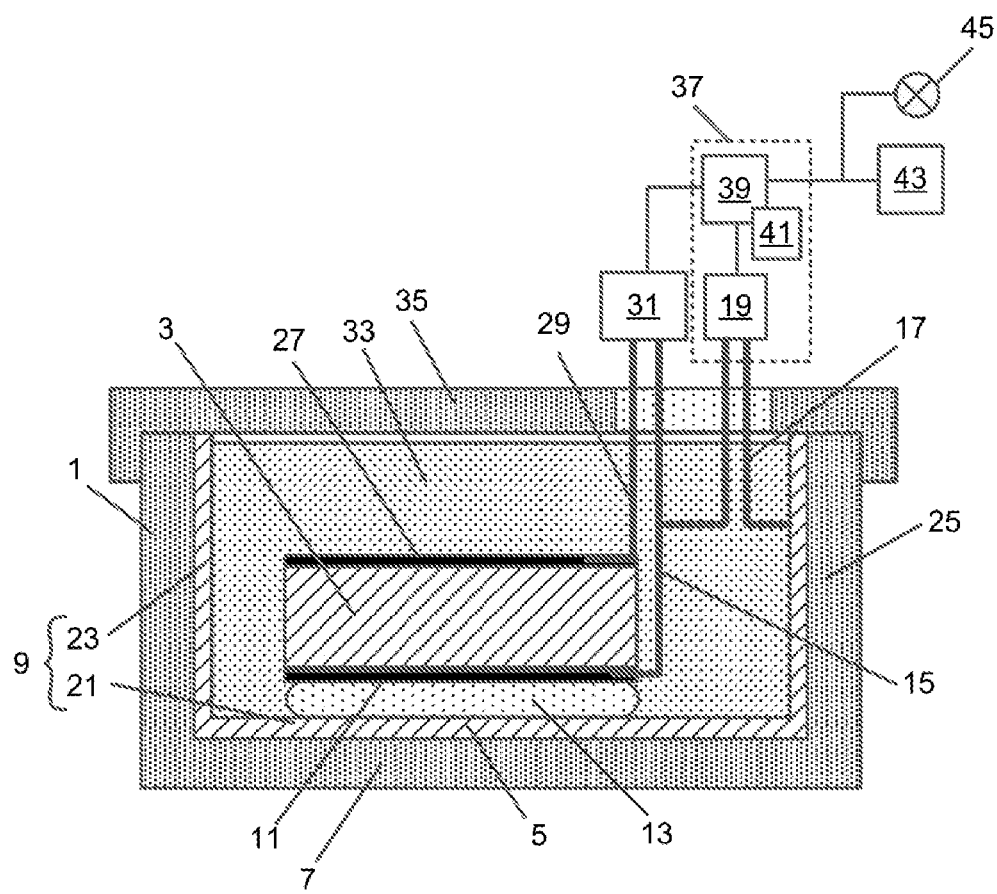
FIG. 5 shows an ultrasonic sensor having a testing device.

In FIG. 5, the testing device 37 comprises the capacitance measuring device 19 connected via the first connecting line 15 of the piezoelectric transducer 3 to the electrode 11 and via the second connecting line 17 to the layer 5.

In addition, the testing device 37 is designed to measure the capacitance C of the capacitor comprising the electrode 11, the electrically conductive layer 5 serving as the counter electrode, and the dielectric coupling layer 13 as a dielectric, at least once, recurrently, periodically, or at specified or specifiable times in each case by means of the capacitance measuring device 19, and to determine and output a quality defect of the ultrasonic transducer if the measured capacitance C is outside the specified capacitance range ΔC.

For this purpose, the testing device 37 can comprise, for example, a control and evaluation unit 39 which is connected to the capacitance measuring device 19 and which triggers the capacitance measurements and checks on the basis of the capacitance Cmeas, which is then measured by means of the capacitance measuring device 19, and the capacitance range ΔC stored, for example, in a memory 41 assigned to the control and evaluation unit 39, whether the measured capacitance Cmeas is within or outside the capacitance range ΔC.

Optionally, the testing device 37, especially, the control and evaluation unit 39, is designed to output an alarm if the check reveals that the measured capacitance Cmeas is outside the specified capacitance range ΔC. The alarm can be output, for example, in the form of an alarm signal via an interface 43 connected to the testing device 37 and/or can be displayed by means of a display element 45, such as a display or a warning lamp, connected to the testing device 37.

As shown in FIG. 5, the ultrasonic sensor comprises the sensor electronic system 31, which is designed according to the intended use of the sensor and connected to the ultrasonic transducer and by means of which the ultrasonic transducer can be operated as a transmitter, as a receiver, or both as a transmitter and as a receiver of ultrasonic signals.

Optionally, the ultrasonic sensor is designed, for example, as a sensor for measuring and/or for monitoring a fill level of a filling material in a container or an open channel. For this purpose, the ultrasonic sensor, especially, its sensor electronic system 31, is designed, for example, according to the embodiments referred to at the outset for ultrasonic sensors operating according to the propagation time principle.

The testing device 37 is preferably designed as part of the sensor electronic system 31 or is connected to the sensor electronic system 31.

In this variant, the control and evaluation unit 39 and/or the sensor electronic system 31 are designed in such a way that a transmitting and/or receiving operation of the ultrasonic sensor, in which ultrasonic signals are transmitted and/or received by means of the ultrasonic transducer, are briefly interrupted during the duration of the respective capacitance measurement.

In the case of ultrasonic sensors having two or more ultrasonic transducers, the quality inspection method can be or is optionally carried out with respect to each of these ultrasonic transducers by means of a correspondingly designed testing device.

Each ultrasonic sensor, which is designed to carry out the quality inspection method described above, offers the advantage that it can automatically and continuously monitor the quality of its ultrasonic transducer, and, during the service life, especially, during operation, of the ultrasonic sensor, can directly determine and output quality defects of the ultrasonic transducer, which occur over time and which can interfere with the function of the ultrasonic sensor. In this case as well, all quality defects that affect the capacitance C are reliably detected and displayed by means of the quality inspection. In addition to the quality defects brought about by the possible causes described above, said quality defects also especially include, for example, deformations of the coupling layer 13 caused by high pressures and/or mechanical loads, and/or damage to the piezoelectric transducer 3 and/or its electrode 11, and changes to the coupling layer 13 caused by aging effects or outgassing. In addition, quality defects caused by moisture penetrating into the housing 1 and/or moisture precipitating as condensate in the housing 1, such as a short circuit caused by moisture, and/or a swelling of the coupling layer 13 caused by moisture, are especially also detected and output as a quality defect.

The invention claimed is:

1. A method for a quality inspection of an ultrasonic transducer, comprising:
providing the ultrasonic transducer, including:
a housing having a housing wall which, on the inside, has an electrically conductive layer extending at least over an inner surface of the housing wall, and
a piezoelectric transducer arranged in the housing and having a first end face equipped with a first electrode, wherein the piezoelectric transducer is connected to the electrically conductive layer via a dielectric coupling layer;
measuring a capacitance of a capacitor formed by the first electrode, the electrically conductive layer serving as a counter electrode, and the dielectric coupling layer as a dielectric; and
determining a quality defect of the ultrasonic transducer when the measured capacitance is outside a specified capacitance range.

2. The method according to claim 1, further comprising:
determining the specified capacitance range in advance by measuring capacitances of a plurality of structurally identical ultrasonic transducers, by determining a target value and a tolerance for the capacitance on the basis of the measured capacitances, and by determining the specified capacitance range on the basis of the target value and the tolerance.

3. The method according to claim 2,
wherein only measured capacitances of ultrasonic transducers that satisfy specified quality standards are used to determine the specified capacitance range,
wherein the ultrasonic transducers that satisfy the specified quality standards are identified, by checking whether the coupling layer thereof fulfills at least one specified quality criterion, fulfills a criterion for a layer thickness of the coupling layer, fulfills a criterion for a homogeneity of the coupling layer, and/or fulfills a criterion for a dielectric constant of the coupling layer.

4. The method according to claim 1,
wherein at least one possible cause of the quality defect determined on the basis of the respective measured capacitance is determined on the basis of at least one measured capacitance outside the specified capacitance range in each case, wherein:
a layer thickness of the coupling layer above a target layer thickness specified for the coupling layer is determined as a possible cause if the measured capacitance is less than a lower limit of the capacitance range,
a layer thickness of the coupling layer below the target layer thickness is determined as a possible cause if the measured capacitance is greater than an upper limit of the specified capacitance range,
inhomogeneities of the coupling layer and/or deviations of a dielectric constant of the coupling layer from a target value specified therefor are determined as a possible cause if the measured capacitance is outside the specified capacitance range,
damage to the piezoelectric transducer and/or the first electrode is determined as a possible cause if the measured capacitance is below the lower limit of the specified capacitance range,
an assembly error, in which the piezoelectric transducer has been mounted in such a way that the first electrode arranged on the first end face thereof is located on the side of the piezoelectric transducer facing away from the coupling layer, is determined as a possible cause if the measured capacitance is below the lower limit of the specified capacitance range,
a short circuit is determined as a possible cause if the measured capacitance is greater than or equal to a specified maximum value above the upper limit of the specified capacitance range, and/or
an impairment of an electrical conductivity of an electrically conductive connection extending from the first electrode via a first connecting line of the piezoelectric transducer is determined as a possible cause if the measured capacitance is less than or equal to a specified minimum value below the lower limit of the specified capacitance range.

5. The method according to claim 1,
wherein the piezoelectric transducer comprises a piezoelectric element on whose end face facing away from the first electrode a second electrode is arranged and/or wherein the dielectric coupling layer is a dielectric coupling layer embodied as an adhesive bond layer or as a potting layer.

6. The method according to claim 1,
a) wherein the housing consists of an electrically conductive material or of a metal and the electrically conductive layer is an integral part of the conductive housing, or
b) wherein the housing consists of an electrical insulator, made of polyphenylene sulfide (PPS) or of an electrically insulating plastic and has, on the inside, an electrically conductive coating which forms or comprises the electrically conductive layer.

7. The method according to claim 1,
wherein the housing consists of an electrical insulator, made of polyphenylene sulfide (PPS) or of an electrically insulating plastic and has, on the inside, an electrically conductive coating which forms or comprises the electrically conductive layer,
wherein the coating includes a coating region which forms the electrically conductive layer and extends over the inner side of the housing wall facing the piezoelectric transducer in the ultrasonic transducer, and
wherein the coating either extends over all inner surfaces of the housing or includes at least one further coating region extending over an inner side of a housing wall surrounding the piezoelectric transducer different from the housing wall facing the piezoelectric transducer.

8. The method according to claim 1,
wherein the ultrasonic transducer is part of an ultrasonic sensor,
wherein the ultrasonic sensor includes a capacitance measuring device that is connected to the first electrode via a first connecting line of the piezoelectric transducer and to the layer via a second connecting line and is designed to measure the capacitance of the capacitor, and
wherein each quality inspection is carried out in each case by means of the capacitance measuring device of the ultrasonic sensor.

9. The method according to claim 8, further comprising:
monitoring the quality of the ultrasonic transducer of the ultrasonic sensor by quality inspections carried out recurrently, periodically, or at specified or specifiable times, and/or
outputting an alarm if a quality defect is detected by means of the quality inspections.

10. A method for producing at least one quality-inspected ultrasonic transducer, the method comprising:
providing a housing having a house wall which, on the inside, has an electrically conductive layer extending at least over an inner surface of the housing wall;
providing a piezoelectric transducer having a first end face equipped with a first electrode;
mounting the piezoelectric transducer in the housing by connecting the first end face of the piezoelectric transducer equipped with the first electrode to the electrically conductive layer via a dielectric coupling layer;
measuring a capacitance of a capacitor formed by the first electrode, the electrically conductive layer serving as a counter electrode, and the dielectric coupling layer as a dielectric;
determining a quality defect of the ultrasonic transducer when the measured capacitance is outside a specified capacitance range; and
providing the ultrasonic transducer as a quality-inspected ultrasonic transducer for further use if the measured capacitance is within the specified capacitance range.

11. The method according to claim 10, further comprising:
disposing of or supplying to a recycling process those ultrasonic transducers in which a quality defect has been determined by the quality inspection; and/or
determining and correcting a method error that led to a quality defect detected via the quality inspection.

12. The method according to claim 10, further comprising:
during the production of each ultrasonic sensor, connecting a sensor electronic system to the piezoelectric transducer of the quality-inspected ultrasonic transducer or one of the quality-inspected ultrasonic transducers.

13. The method according to claim 12, further comprising:
introducing a potting into the housing; and/or
closing the housing by a closure element.

14. An ultrasonic sensor, comprising:
a housing having a house wall which, on the inside, has an electrically conductive layer extending at least over an inner surface of the housing wall;
a piezoelectric transducer having a first end face equipped with a first electrode, wherein the piezoelectric transducer is mounted in the housing by connecting the first end face of the piezoelectric transducer equipped with the first electrode to the electrically conductive layer via a dielectric coupling layer, wherein the housing and the piezoelectric transducer form an ultrasonic transducer; and
a testing device, wherein the testing device includes a capacitance measuring device connected via a first connecting line of the piezoelectric transducer to the first electrode and via a second connecting line to the electrically conductive layer, wherein the capacitance measuring device is designed to measure a capacitance of a capacitor comprising the first electrode, the electrically conductive layer serving as a counter electrode, and the dielectric coupling layer as a dielectric,
wherein the testing device is designed to measure, at least once, recurrently, periodically, or at specified or specifiable times, the capacitance of the capacitor via the capacitance measuring device in each case and to determine and output a quality defect of the ultrasonic transducer if the measured capacitance is outside a specified capacitance range.

15. The ultrasonic sensor according to claim 14,
wherein the testing device includes a control and evaluation unit connected to the capacitance measuring device and designed to trigger the capacitance measurements and to check, on the basis of the capacitance measured by means of the capacitance measuring device and the specified capacitance range stored in a memory assigned to the control and evaluation unit, whether the measured capacitance is within or outside the specified capacitance range,
wherein the testing device is designed to output or display an alarm if the measured capacitance is outside the specified capacitance range,
wherein the testing device is designed as part of a sensor electronic system of the ultrasonic sensor or is connected to the sensor electronic system, by means of which the ultrasonic transducer can be operated as a transmitter, as a receiver, or as both a transmitter and a receiver of ultrasonic signals, wherein the control and evaluation unit and/or the sensor electronic system are designed in such a way that a transmitting and/or receiving operation of the ultrasonic sensor, in which ultrasonic signals are transmitted and/or received by means of the ultrasonic transducer, is interrupted during the duration of the respective capacitance measurement, and/or wherein the ultrasonic sensor is designed as a sensor operating according to the propagation time principle for measuring and/or monitoring a fill level of a filling material.

\* \* \* \* \*